United States Patent [19]
Poutasse et al.

[11] Patent Number: 5,525,433
[45] Date of Patent: Jun. 11, 1996

[54] EPOXY ADHESIVES AND COPPER FOILS AND COPPER CLAD LAMINATES USING SAME

[75] Inventors: Charles A. Poutasse, Beachwood; Katherine V. Sack, No. Olmsted; Andrea M. Kovacs, Bay Village; James R. Winchester, East Cleveland, all of Ohio

[73] Assignee: Gould Electronics Inc., Eastlake, Ohio

[21] Appl. No.: 468,655

[22] Filed: Jun. 6, 1995

Related U.S. Application Data

[63] Continuation of Ser. No. 220,725, Mar. 30, 1994, abandoned.

[51] Int. Cl.$^6$ ............ B32B 15/20; C08F 283/00
[52] U.S. Cl. ............ 428/674; 525/504; 525/510; 525/526; 528/93; 528/103; 528/111; 428/416; 428/457; 428/555; 428/570; 428/418; 428/594; 428/615; 428/626; 428/642; 428/643; 428/644; 428/675; 428/676
[58] Field of Search ............ 525/526, 504, 525/510; 528/103, 93, 111; 428/416, 418, 555, 570, 594, 615, 626, 642, 643, 644, 674, 675, 676, 457

[56] References Cited

U.S. PATENT DOCUMENTS

| | | | |
|---|---|---|---|
| 4,310,695 | 1/1982 | Dante | 525/523 |
| 4,348,505 | 9/1982 | DiBenedetto et al. | 525/507 |
| 4,386,939 | 6/1983 | Lange | 44/63 |
| 4,526,940 | 7/1985 | Seymour et al. | 525/524 |
| 4,803,543 | 2/1989 | Inayoshi et al. | 357/72 |
| 4,833,204 | 5/1989 | Yusa et al. | 528/94 |
| 5,017,271 | 5/1991 | Whewell et al. | 204/15 |

OTHER PUBLICATIONS

Kanao et al, "New Adhesive Coated Foil for Paper Phenolic Laminates," Technical Paper, IPC/ERSO Joint Conf., Oct. 17–19, 1989.
Chemical Abstract 112:180197g, "Manufacture of Poly(vinyl acetal) Resins," Issue 11, 1990.
Chemical Abstract 112:180932t, "Heat Resistant Adhesive Compositions Containing Modified Vinyl Acetal Resin for Circuit Boards," Issue 11, 1990.
Chemical Abstract 112:120226f, "Adhesives Compositions for Copper–Clad Laminates for Electric Circuit Boards," Issue 8, 1990.
Chemical Abstract 112:140937s, "Adhesives for Manufacture of Copper–Clad Laminates," Issue 9, 1990.
Chemical Abstract 111:116483z, "Graft Polymer–Containing Epoxy Resin Adhesives for Metal–Clad Laminates," Issue 21, 1989.
Chemical Abstract 112:8474j, "Adhesives for Metal–Clad Laminates," Issue 2, 1990.
Chemical Abstract 112:8555m, "Adhesives for Copper–Clad Laminates," Issue 2, 1990.
Chemical Abstract 112:8556n, "Adhesives for Copper–Clad Laminates," Issue 2, 1990.
Chemical Abstract 111:155474s, "Coating of Copper Foil With Thermally Reactive Adhesives," Issue 23, 1989.
Chemical Abstract 111:116571b, "Adhesive–Coated Metal Foils," Issue 21, 1989.
Chemical Abstract 112:140938t, "Adhesives for Manufacture of Copper–Clad Laminates," Issue 9, 1990.
Chemical Abstract 117:173148s, "Adhesives for Bonding Metal Foils to Prepregs," Issue 23, 1992.
Chemical Abstract 117:113223c, "Manufacture of Adhesive–Coated Metal Foils for Laminates," Issue 20, 1992.
Chemical Abstract 117:252990p, "Adhesives for Copper–Clad Laminates," Issue 1, 1993.
Chemical Abstract 117:113086k, "Poly(vinyl butyral)Adhesives, Adhesive–Coated Copper Foils, and Copper, Clad Laminates," Issue 20, 1992.

*Primary Examiner*—Melvyn I. Marquis
*Assistant Examiner*—Randy Gulakowski
*Attorney, Agent, or Firm*—Michael A. Centanni

[57] ABSTRACT

This invention relates to an adhesive composition, comprising: (A) at least one multifunctional epoxy; and (B) the composition derived from (B-1) at least one difunetional epoxy resin and (B-2) at least one compound represented by the formula $$R\text{—}(G)_n \qquad (I)$$

wherein in Formula (I): R is an aromatic, alicyclic or heterocyclic group; G is a functional group selected from the group consisting of COOH, OH, SH, $NH_2$, $NHR^1$, $(NHC(=NH))_m NH_2$, $R^2COOH$, $R^2OH$, $R^2SH$, $R^2NH_2$ and $R^2NHR^1$, wherein $R^1$ is a hydrocarbon group, $R^2$ is an alkylene or alkylidene group and m is a number in the range of 1 to about 4; and n is a number ranging from 3 up to the number of displaceable hydrogens on R; with the proviso that when at least one G is $NH_2$ or $R^2NH_2$, n is a number ranging from 2 up to the number of displaceable hydrogens on R, and when at least one G is $(NHC(=NH))_m NH_2$, n is a number ranging from 1 up to the number of displaceable hydrogens on R. The invention also relates to copper foils having the foregoing adhesive composition adhered to at least one side thereof to enhance the adhesion between said foils and dielectric substrates. The invention also relates to laminates comprising copper foil, a dielectric substrate, and an adhesion-promoting layer comprising the foregoing adhesive composition disposed between and adhered to the foil and the substrate.

19 Claims, No Drawings

EPOXY ADHESIVES AND COPPER FOILS AND COPPER CLAD LAMINATES USING SAME

This is a continuation application of application Ser. No. 08/220,725 filed Mar. 30, 1994 now abandoned.

TECHNICAL FIELD

This invention relates to epoxy adhesives and, more particularly, to epoxy adhesives for use with copper foils. The epoxy adhesives provide the copper foils with an adhesion-promoting layer which facilitates the production of laminates used in making printed circuit boards.

BACKGROUND OF THE INVENTION

Nearly half of the laminates manufactured for the printed circuit board industry use copper foil coated with an adhesive. These foils are laminated to a phenolic prepreg to make a low cost, copper clad paper phenolic laminate. The adhesives tend to fall into two categories: (1) a water dispersed adhesive composed of a copolymer of acrylonitrile and methacrylate and a phenolic resole, and (2) a solvent based adhesive composed of a phenolic resole, a polyvinylbutyral resin and a multifunctional epoxy, typically an epoxidized phenolic novolac.

Generally, these adhesives either provide good adhesion to metal and laminate as measured by peel strength, but less than satisfactory high temperature stability as measured in the solder blister resistance test; or they provide good high temperature stability, but less than satisfactory adhesion. This is because each of these goals are usually in direct conflict with one another. A material that is flexible enough to have high adhesion will generally exhibit too much flow at elevated temperatures to provide sufficient heat resistance. To have good heat resistance, an adhesive must be quite rigid and such rigidity reduces peel strength.

These problems have been overcome by the present invention. By virtue of the present invention there has been developed an epoxy adhesive composition that provides both good adhesion as measured by peel strength testing and good heat resistance as measured by solder blister testing.

SUMMARY OF THE INVENTION

This invention relates to an adhesive composition, comprising: (A) at least one multifunctional epoxy; and (B) the composition derived from (B-1) at least one difunctional epoxy resin and (B-2) at least one compound represented by the formula

$$R\text{---}(G)_n \qquad (I)$$

wherein in Formula (I): R is an aromatic, alicyclic or heterocyclic group; G is a functional group selected from the group consisting of COOH, OH, SH, $NH_2$, $NHR^1$, $(NHC(=NH))_m NH_2$, $R^2 COOH$, $R^2 OH$, $R^2 SH$, $R^2 NH_2$ and $R^2 NHR^1$, wherein $R^1$ is a hydrocarbon group, $R^2$ is an alkylene or alkylidene group and m is a number in the range of 1 to about 4; and n is a number ranging from 3 up to the number of displaceable hydrogens on R; with the proviso that when at least one G is $NH_2$ or $R^2 NH_2$, n is a number ranging from 2 up to the number of displaceable hydrogens on R, and when at least one G is $(NHC(=NH))_m NH_2$, n is a number ranging from 1 up to the number of displaceable hydrogens on R. The invention also relates to copper foils having the foregoing adhesive composition adhered to at least one side thereof to enhance the adhesion between said foils and dielectric substrates. The invention also relates to laminates comprising copper foil, a dielectric substrate, and an adhesion-promoting layer comprising the foregoing adhesive composition disposed between and adhered to the foil and the substrate.

DESCRIPTION OF THE PREFERRED EMBODIMENTS

The multifunctional epoxies (A) are those epoxies containing an average of more than two epoxy groups (oxirane rings) per molecule. In one embodiment these epoxies contain an average of up to about six epoxy groups per molecule. In one embodiment the multifunctional epoxy is an epoxy novolac resin. The multifunctional epoxy can be a trifunctional or tetrafunctional epoxy resin. (A trifunctional epoxy resin is an epoxy resin that contains an average of three epoxy groups per molecule, and a tetrafunctional epoxy resin contains an average of four epoxy groups per molecule.) The multifunctional epoxies typically have average epoxy equivalent weights in the range of about 100 to about 250, and in one embodiment from about 190 to about 240. (An epoxy equivalent weight is the molecular weight of the epoxy molecule divided by the number of epoxy groups in the molecule. Thus, for example, a trifunctional epoxy having a molecular weight of 600 would have an epoxy equivalent weight of 200.)

Examples of commercially available trifunctional epoxy resins that are useful include Tactix 742 (Dow Chemical) and PT 810 (Ciba Geigy). Examples of commercially available tetrafunctional epoxy resins that are useful include MT 0163 (Ciba Geigy), Epon 1031 (Shell)and Epon HPT 1071 (Shell).

The epoxy novolacs that are useful include the epoxy cresols and the epoxy phenol novolacs. Examples of commercially available novolacs that are useful include DEN 438, DEN 439 and Tactix 785 (each of which is available from Dow), DPS 164 (Shell) and ECN 1299 (Ciba Geigy).

The difunctional epoxy resin (B-1) can be any difunctional epoxy resin having an average molecular weight in the range of about 1000 to about 10,000 (epoxy equivalent weight of about 500 to about 5000), and in one embodiment an average molecular weight of about 1000 to about 6000. (A difunctional epoxy resin is an epoxy resin that contains an average of two epoxy groups per molecule.) In one embodiment, a mixture of difunctional epoxy resins is used, one having an average molecular weight of about 1000 to about 3000, preferably about 1500 to about 2500; and the other having an average molecular weight in excess of about 3000 up to about 6000, preferably about 3500 to about 5000.

In one embodiment the difunctional epoxy resin (B-1) is a compound represented by the formula:

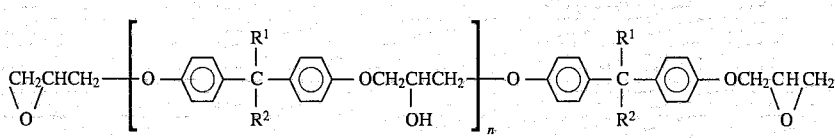

wherein in Formula (II), $R^1$ and $R^2$ are independently hydrogen or hydrocarbon groups in the range of 1 to about 20 carbon atoms, and n is a number in the range of 1 to about 20, preferably 1 to about 6, and in one embodiment 1 to about 3, and in another embodiment 1 or 2. Examples include: bisphenol A wherein $R^1$ and $R^2$ are each $CH_3$; bisphenol F wherein $R^1$ and $R^2$ are each H; bisphenol AD wherein $R^1$ is H and $R^2$ is $CH_3$. Others include resins wherein: $R^1$ is H and $R^2$ is $C_6H_{13}$; $R^1$ is H and $R^2$ is $C_{12}H_{25}$; $R^1$ is $CH_3$ and $R^2$ is $C_2H_5$; $R^1$ is $CH_3$ and $R^2$ is $C_4H_9$; etc.

The compound (B-2) is at least one compound represented by the formula $$R-(G)_n \qquad (I)$$

In Formula (I) R is an aromatic, alicyclic or heterocyclic group. G is a functional group selected from the group consisting of COOH, OH, SH, $NH_2$, $NHR^1$, $(NHC(=NH))_mNH_2$, $R^2COOH$, $R^2OH$, $R^2SH$, $R^2NH_2$ and $R^2NHR^1$, wherein $R^1$ is a hydrocarbon group, preferably an alkyl group, of 1 to about 6 carbon atoms, more preferably 1 to about 3 carbon atoms, and $R^2$ is an alkylene or alkylidene group, preferably an alkylene group, of 1 to about 6 carbon atoms, more preferably 1, 2 or 3 carbon atoms, and m is a number in the range of 1 to about 4 and in one embodiment m is 2. G is preferably $NH_2$, OH or $CH_2NH_2$. n is a number ranging from 3 up to the number of displaceable hydrogens on R, with the proviso that when at least one G is $NH_2$ or $R^2NH_2$, n is a number ranging from 2 up to the number of displaceable hydrogens on R, and when at least one G is $(NHC(=NH))_mNH_2$, n is a number ranging from 1 up to the number of displaceable hydrogens on R. n is preferably 3, except when at least one G is $NH_2$ or $R^2NH_2$ and then it is preferably 2, and except when G is $(NHC(=NH))_mNH_2$ and then it is preferably 1.

The aromatic R groups in Formula (I) can be mononuclear, e.g., benzene; polynuclear wherein the aromatic nucleus is of the fused type with the aromatic nucleus being fused at two points to another nucleus, e.g., naphthalene, or of the linked type wherein at least two nuclei (mononuclear or polynuclear) are linked through bridging linkages to each other. These bridging linkages can be carbon-to-carbon single bonds, ether linkages, keto linkages, sulfide linkages, sulfur atoms, sulfinyl linkages, sulfonyl linkages, alkylene linkages, alkylidene linkages, amino linkages, etc. Normally the aromatic group R is a benzene nucleus. These aromatic groups can be alkyl-substituted aromatic groups wherein one or more alkyl groups (e.g., $C_1$–$C_{10}$) are attached to the aromatic nucleus.

The alicyclic R group in Formula (I) can be saturated or unsaturated and preferably has from 3 to 6 carbon atoms, more preferably 5 or 6 carbon atoms. These cyclic groups can be alkyl-substituted alicyclic groups wherein one or more alkyl groups (e.g., $C_1$–$C_{10}$) are attached to ring carbon atoms. Examples include R groups derived from cyclopropane, cyclobutane, cyclopentane, cyclopentene, 1,3-cyclopentadiene, cyclohexane, cyclohexene, 1,3-cyclohexadiene, etc.

The heterocyclic R group in Formula (I) is preferably derived from a 5- or 6-membered ring compound wherein the hetero atom(s) are N, S or O. These cyclic groups can be alkyl-substituted heterocyclic groups wherein one or more alkyl groups (e.g., $C_1$–$C_{10}$) are attached to ring carbon or N atoms. Examples include R groups derived from pyrrole, furan, thiophene, pyridine, etc.

Useful examples of compound (B-2) include o-aminophenol, m-aminophenol, p-aminophenol, o-phenylenediamine, m-phenylenediamine, p-phenylene diamine, 1,3-xylylenediamine, isophoronediamine, 1,3,5-trihydroxy benzene, diaminodiphenylsulfone, 1,4-xylylenediamine, 3-aminophenylsulfone, 1,4-cyclohexanediamine, 1,3-cyclohexanediamine, 1-o-tolylbiguanide, and mixtures of two or more thereof.

In one embodiment components (B-1) and (B-2) are merely blended with each other prior to or at the time of mixing with component (A). In this embodiment components (B-1) and (B-2) are not pre-reacted with each other. In one embodiment components (B-1) and (B-2) are pre-reacted with each other prior to being combined with component (A). This reaction can be effected by contacting component (B-1) with component (B-2) under reaction conditions until the desired product is obtained. In either case, the ratio of equivalents of (B-1) to (B-2) is generally from about 1:2 to about 1:4, and in one embodiment from about 1:2.5 to about 1:3.5. The weight of an equivalent of component (B-1) is determined by dividing the molecular weight of component (B-1) by the average number of epoxy groups per molecule in (B-1). The weight of an equivalent of (B-2) is determined by dividing the molecular weight of (B-2) by the number of functional groups, G, per molecule in (B-2). In determining the number of functional groups in (B-2), COOH, SH, $NHR^1$, $R^2COOH$, $R^2SH$ and $R^2NHR^1$ are each counted as one functional group. $NH_2$ and $R^2NH_2$ are each counted as two functional groups. The number of functional groups in $(NHC(=NH))_mNH_2$ is equal to the number of reactive nitrogen sites in the group. Thus, for example, when G is $NHC(=NH)NHC(=NH)NH_2$ it is counted as 6 functional groups.

When components (B-1) and (B-2) are pre-reacted with each other the reaction temperature is generally from about 60° C. to about 150° C., and in one embodiment from about 80° C. to about 110° C. The time required to complete the reaction is dependent upon the desired degree of reaction, but is generally from about 2 to about 24 hours, and in one embodiment from about 4 to about 8 hours. In one embodiment either or both of components (B-1) and (B-2) are dissolved in a suitable solvent prior to being reacted with each other. Examples of such solvents include methylisobutylketone, methyl ethyl ketone, benzene, toluene, acetone, tetrahydrofuran, etc.

In one embodiment the inventive epoxy adhesive composition contains an effective amount of a supplemental adduct (C) to enhance the curing of the epoxy adhesive composition. This supplemental adduct is the reaction product of at least one difunctional epoxy resin with at least one alkylene polyamine. The difunctional epoxy resins are the same as the resins (B-1) discussed above. The alkylene polyamines are compounds represented by the formula

wherein in Formula (III), each $R^1$ is independently hydrogen or a hydrocarbon group, preferably alkyl, of 1 to about 10 carbon atoms, preferably 1 to about 4 carbon atoms; $R^2$ is an alkylene group of preferably 1 to about 4 carbon atom, more preferably 2 or 3 carbon atoms; and n is a number in the range of 1 to about 10, preferably 1 to about 4, more preferably 1 or 2. Examples include ethylene diamine, triethylene tetramine, propylene diamine, trimethylene diamine, etc. The reaction between the difunctional epoxy resin and the alkylene polyamine is generally carried out at a temperature of from about 25° C. to about 100° C, and in one embodiment from about 70° C. to about 90° C. The time required to complete the reaction is dependent upon the desired degree of reaction, but is generally from about 2 to about 24 hours, and in one embodiment from about 2 to about 4 hours. In one embodiment either or both of the reactants are dissolved in a suitable solvent prior to being reacted with each other. Examples of such solvents include methylisobutylketone, methylethylketone, benzene, toluene, acetone, tetrahydrofuran, etc.

The inventive epoxy adhesive compositions preferably comprise from about 10% to about 40% by weight, and in one embodiment about 20% to about 30% by weight of the multifunctional epoxy (A) ; from about 40% to about 80% by weight, and in one embodiment about 55% to about 75% by weight of the composition and up to about 25% by weight, and in one embodiment from about 5% to about 15% by weight of the supplemental adduct (C).

In one embodiment the inventive epoxy adhesive compositions contain an effective amount of at least one low molecular weight difunctional epoxy compound to enhance the adhesive characteristics of these compositions. These low molecular weight epoxies typically have molecular weights in the range of about 160 to about 400, and in one embodiment from about 200 to about 250. In one embodiment the low molecular weight epoxy is represented by the formula

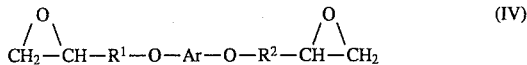

wherein in Formula (IV), Ar is an aromatic or cycloaliphatic group of the type discussed above with respect to Formula (I) with the mononuclear groups (e.g., benzene) being preferred, and $R^1$ and $R^2$ are independently alkylene or alkylidene groups of preferably 1 to about 6 carbon atoms, and in one embodiment from 1 to about 3 carbon atom. An example of a useful low molecular weight difunctional epoxy is one in which Ar is a benzene nucleus, and $R^1$ and $R^2$ are each methylene; this compound being available under the tradename Heloxy 69 from Rhone Poulenc. These low molecular weight difunctional epoxies are present in the inventive adhesive compositions at concentrations of up to about 10% by weight, and in one embodiment up to about 5% by weight.

In one embodiment the inventive epoxy adhesive composition contains an effective mount of at least one phenolic resole to enhance the adhesive characteristics of these compositions. The,se resoles are typically provided in diluted form, the diluent being a suitable solvent such as ethanol, and having a solids content of, for example, about 50% to about 70% by weight. Useful phenolic resoles typically have gel times of about 30 to about 200 seconds at 150° C., and in one embodiment about 90 to about 140 seconds at 150° C. Commercially available phenolic resoles that are useful include PR-GNF-1 (a product of Sumitomo Durez identified as having a 60% by weight solids content in ethanol and a gel time of 90 to 140 seconds at 150° C), and Arofene 536-E-56 (Ashland Chemical). The phenolic resoles are present in the inventive adhesive compositions at concentrations of up to about 5% by weight, and in one embodiment up to about 3% by weight.

The foil used with this invention is preferably a copper or copper-based alloy foil. These foils are well known in the art and are made using one of two techniques. Wrought or rolled foil is produced by mechanically reducing the thickness of a copper or copper alloy strip or ingot by a process such as rolling. Electrodeposited foil is produced by electrolytically depositing copper ions on a rotating cathode drum and then peeling the deposited strip from the cathode. Electrodeposited copper foils are especially preferred.

The copper foils typically have nominal thicknesses ranging from about 0.0002 inch to about 0.02 inch. Foil thickness is sometimes expressed in terms weight and typically the foils of the present invention have weights or thicknesses ranging from about ⅛ to about 14 oz/ft².

Electrodeposited copper foils have a smooth or shiny (drum) side and a rough or matte (copper deposit growth front) side. An adhesion promoting layer can be adhered to either side of the foil and in some instances is adhered to both sides.

In one embodiment, the side or sides of the foil (electrodeposited or wrought) to which the adhesion-promoting layer is adhered is a "standard-profile surface," "low-profile surface" or "very-low-profile surface." The term "standard-profile surface" is used herein to refer to a foil surface having an $R_{tm}$ of about 10 µm or less. The term "low-profile surface" refers to a foil surface having an $R_{tm}$ of about 7 µm or less. The term "very-low-profile surface" refers to a foil surface having an $R_{tm}$ of about 4 µm or less. $R_{tm}$ is the mean of the maximum peak-to-valley vertical measurement from each of five consecutive sampling measurements, and can be measured using a Surftronic 3 profilometer marketed by Rank Taylor Hobson, Ltd., Leicester, England.

Although the inventive foils can be subjected to a surface roughening treatment prior to the application of the adhesion promoting layer, it is a significant advantage of the invention that desired adhesive characteristics for the foil can be achieved without subjecting the foil to an added surface roughening treatment. Thus, in one embodiment of the invention, the foil is characterized by the absence of any added surface roughening treatment on the side or sides to which the adhesion-promoting layer is adhered. The term added surface roughening treatment refers to any treatment performed on a base or raw foil that increases the roughness of the surface of the foil. These treatments include copper deposited electrolytically in nodular or powder form, or copper oxide which grows nodular or dendritic. In one embodiment, mechanical roughness imparted to wrought copper foil during rolling or by subsequent abrasion which increases roughness beyond that of a standard profile surface is considered to be an added surface roughening treatment. In one embodiment, roughness imparted to an electrodeposited copper foil during electrodeposition which increases roughness beyond that of a standard profile surface is considered to be an added surface toughening. In one embodiment, any roughness imparted to the raw or base copper foil that increases the roughness of said foil beyond that of a standard profile surface is considered to be an added surface roughening treatment. In one embodiment, any roughness imparted to the raw or base copper foil that increases the roughness of said foil beyond that of a low-profile surface is considered an added surface roughening treatment. In one embodiment, any roughness imparted to the raw or base copper foil that increases the roughness of said foil beyond that of a very low-profile surface is considered an added surface toughening treatment.

In one embodiment, the side or sides of the base or raw foil to which the adhesion-promoting layer is adhered is untreated prior to the application of the adhesion-promoting layer to the foil. The ten "untreated" is used herein to refer to raw or base foil that has not undergone subsequent treatment for the purpose of refining or enhancing the foil properties.

As indicated above, it is within the scope of the invention to apply to foils which have been subjected to an added surface toughening treatment the inventive adhesion promoting layer. Thus, in one embodiment, one or both sides of the foil are treated with a roughened layer of copper or copper oxide prior to the application of the adhesion promoting layer. The copper can be deposited electrolytically in nodular or powder form. The copper oxide can grow nodular or dendritic.

In one embodiment, the side or sides of the base or raw foil to which the adhesion-promoting layer is adhered is treated, prior to the application of the adhesion-promoting layer, with one or more surface treatment layers for the purpose of refining or enhancing the foil properties. Any side of the foil which does not have an adhesion-promoting layer applied to it can, optionally, also have one or more of such treatment layers applied to it. These surface treatments are known in the art.

In one embodiment one or both sides of the foil are treated with at least one metallic layer, the metal in said metallic layer being selected from the group consisting of indium, zinc, tin, nickel, cobalt, brass, bronze, and mixtures of two or more thereof, prior to the application of the adhesion promoting layer. Metallic layers of this type are sometimes referred to as barrier layers. These metallic layers preferably have thicknesses in the range of about 0.01 to about 1 micron, more preferably about 0.05 to about 0.1 micron.

In one embodiment one or both sides of the foil are treated with at least one metallic layer, the metal in said metallic layer being tin, chromium, chromium-zinc alloy, zinc, nickel, molybdenum, aluminum, or a mixture of two or more thereof, prior to the application of the adhesion promoting layer. Metallic layers of this type are sometimes referred to as stabilization layers. These metallic layers preferably have thicknesses in the range of about 0.005 to about 0.05 micron, more preferably about 0.01 to about 0.02 micron.

In one embodiment, one or both sides of the foil are first treated with at least one barrier layer, then at least one stabilization layer, as discussed above, prior to the application of the adhesion promoting layer.

In one embodiment, one or both sides of the foil are treated with at least one toughened layer of copper or copper oxide, then at least one barrier layer of the type discussed above prior to the application of the adhesion promoting layer.

In one embodiment, one or both sides of the foil are treated with at least one toughened layer of copper or copper oxide, then at least one stabilization layer of the type discussed above is adhered to the layer of copper or copper oxide prior to the application of the adhesion promoting layer.

In one embodiment, one or both sides of the foil are treated with at least one roughened layer of copper or copper oxide, then at least one barrier layer of the type discussed above is adhered to the roughened layer, then at least one stabilization layer is adhered to the barrier layer prior to the application of the adhesion promoting layer.

In one embodiment, one or both sides of the foil is treated with an adhesion-promoting amount of at least one organofunctional silane. The silane can be adhered to the base foil or any of the treatment layers discussed above. It is used as the outermost treatment layer on the foil and contacts the inventive epoxy adhesive when the latter is applied to the foil. The silane can be at least one silane coupling agent represented by the formula

$$R^1{}_{4-n}SiX_n \qquad (V)$$

wherein in Formula (V), $R^1$ is a functionally substituted hydrocarbon group, the functional substituent of said functionally substituted hydrocarbon group being amino, hydroxy, halo, mercapto, alkoxy, acyl, or epoxy; X is a hydrolyzable group; and n is 1, 2 or 3. Examples of organofunctional silanes that can be used include glycidoxypropyltrimethoxy silane, aminopropyl trimethoxysilane, N-(2-aminoethyl)-3-aminopropyltrimethoxy silane, tetraethoxy silane, mixtures of two or more thereof, etc. Mixtures of glycidoxypropyltrimethoxy silane and tetraethoxy silane are useful; these include mixtures of these two silanes at weight ratios of about 95:5 to about 5:95, and in one embodiment at about 50:50. Mixtures of N-(2-aminoethyl)-3-amino propyltrimethoxysilane and tetraethoxy silane are also useful; these include mixtures of these two silanes at weight ratios of about 1:99 to about 99:1, and in one embodiment from about 10:90 to about 90:10.

The inventive epoxy adhesive composition is adapted for enhancing adhesion between the foil and a dielectric substrate. The inventive epoxy adhesive is applied to one or both sides of the foil, the foil surface to which the resulting adhesion promoting layer is applied being untreated or treated as discussed above. The epoxy adhesive layer may be applied to the foil surface using known application methods which include reverse roller coating, doctor blade coating, dipping, painting and spraying. The process of applying the epoxy adhesive may be repeated, if desired, several times.

The application of the inventive epoxy adhesive to the foil surface is typically effected at a temperature of preferably about 15° C. to about 45° C., more preferably about 20° C. to about 30° C. Following application of the inventive epoxy adhesive-promoting layer to the foil surface, the epoxy adhesive is semi-cured (B-staged) by heating it to a temperature of preferably about 90° C. to about 180° C., and in one embodiment about 140° C. to 170° C., for preferably about 0.5 to about 10 minutes, and in one embodiment about 1 to about 5 minutes to enhance drying of the surface. The dry film weight of the B-staged epoxy adhesive on the foil is preferably from about 20 to about 50 grams per meter squared ($gm/m^2$), more preferably about 25 to about 35 $gms/m^2$.

The inventive copper foils with the B-staged epoxy adhesive applied thereto preferably have a matte-side roughness, $R_{tm}$, of about 2 to about 18 μm, more preferably about 4 to about 11 μm, more preferably about 5 to about 8 μm. In one embodiment of the invention, these foils have weights of about ½ ounce per square foot and the $R_{tm}$ of the matte side is preferably about 2 to about 12 μm, more preferably about 4 to about 8 μm. In one embodiment, these foils have weights of about 1 ounce per square foot and the $R_{tm}$ of the matte side is preferably about 2 to about 16 μm, more preferably about 5 to about 9 μm. In one embodiment, these foils have weights of about 2 ounces, per square foot and the $R_{tm}$ of the matte side is preferably about 6 to about 18 µm, more preferably about 8 to about 11 µm. The $R_{tm}$ for the shiny side of these foils is preferably less than about 4 µm, more preferably less than about 3 µm, and is preferably in the range of about 1.5 to about 3 µm, more preferably in the range of about 2 to about 2.5 µm.

The inventive copper foils with the B-staged epoxy adhesive applied thereto can be bonded to dielectric substrates. The adhesion promoting layer provided by the inventive epoxy adhesive enhances the bond or peel strength between the copper foil and the dielectric substrate. An advantage of the inventive copper foils is that these foils can avoid the application of any added surface roughening, yet exhibit effective bond or peel strength with dielectric substrates. These foils can have a standard profile surface, low-profile surface and even a very low-profile surface, and yet provide acceptable peel strengths. With the inventive foils, either the matte side or shiny side can be effectively bonded to a dielectric substrate.

Useful dielectric substrates may be prepared by impregnating woven glass reinforcement materials with partially cured resins, usually epoxy rosins. Other useful resins include amino type resins produced from the reaction of formaldehyde and urea or formaldehyde and melamine, polyesters, phenolics, silicones, polyamides, polyimides, bismaleimides, polyphenyleneoxides, cyanate esters, di-anyl phthalates, phenylsilanes, polybenizimidazoles, diphenyloxides, polytetrafluoroethylenes, and the like, as well as mixtures of two or more thereof. Particularly useful are the paper phenolic substrates. These dielectric substrates are sometimes referred to as prepregs.

In preparing the laminates, it is useful for both the prepreg material and the copper foil to be provided in the form of long webs of material rolled up in rolls. The rolled materials are drawn off the rolls and cut into rectangular sheets. The rectangular sheets are then laid-up or assembled in stacks of assemblages. Each assemblage may comprise a prepreg sheet with a sheet of foil on either side thereof, and in each instance, the side (or one of the sides) of the copper foil sheet with the adhesion-promoting layer adhered thereto is positioned adjacent the prepreg.

The assemblage may be subjected to conventional laminating temperatures and pressures between the plates of laminating presses to prepare laminates comprising sandwiches of a sheet of prepreg between sheets of copper foil. Alternatively, a continuous lamination process may be used where the foil and prepreg are unrolled and passed through a heated press as a continuous web and cut into sheets afterwards.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 1000 to about 2000 psi, temperatures in the range of from about 150° C. to 180° C. and a laminating cycle of from about 50 minutes to about 2 hours. In one embodiment, a continuous lamination process is used wherein a vacuum is used, the temperature is up to about 200° C, and the lamination time is less than about 30 minutes. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second adhesion-promoting layer is then applied over the etched pattern using the techniques discussed above and then a second prepreg is adhered to the etched pattern; the second adhesion-promoting layer being positioned between and adhered to both the etched pattern and the second prepreg. The techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications including radios, televisions, computers, etc., for the PCB's. These methods and end uses are known in the art.

The following examples are provided for purposes of illustrating the invention. Unless otherwise indicated, in the following example as well as throughout the specification and claims, all parts and percentages are by weight, all temperatures are in degrees centigrade, and all pressures are atmospheric.

EXAMPLES 1–5

Adduct (B-I)

75 grams of DER 664 (a product of Dow Chemical identified as a bisphenol A epoxy resin having an epoxy equivalent weight of about 875–975) are dissolved in 55 grams of methylisobutylketone with heating overnight to provide an epoxy solution. 9.3 grams of m-aminophenol are dissolved in 20 grams of methylisobutylketone with heating to provide a reagent solution. The reagent solution is added to the epoxy solution and heated to 115° C. for 6 hours to provide a product that is 96% reacted based on epoxy titration.

Adduct (B-II)

75 grams of DER 667 (a product of Dow Chemical identified as a bisphenol A epoxy resin having an epoxy equivalent weight of about 1600–2000) are dissolved in 75 grams of methylisobutylketone with heating overnight to provide an epoxy solution. 4.5 grams of m-aminophenol are dissolved in 15 grams of methylisobutylketone with heating to provide a reagent solution. The reagent solution is added to the epoxy solution and heated to 115° C. for 10.5 hours to provide a product that is 90% reacted based on epoxy titration.

Adducts (B-I) and (B-II) are blended with various multifunctional epoxies as indicated in Table I below to provide the roll coat formulations indicated in the table. The multifunctional epoxies that are used are:

MT 0163 (a product of Ciba Geigy identified as a tetrafunctional epoxy resin);

Tactix 785 (a product of Dow Chemical identified as an epoxy novolac); and

DPS 164 (a product of Shell identified as an epoxy novolac).

The foil that is used is an electrodeposited copper foil having a-weight of 1-oz/ft$^2$, and having treatment layers of copper oxide followed by brass and then chromium-zinc ahoy. The formulations indicated in Table I are applied to the matte surface of the foil and partially cured or B-staged at a temperature of 150° C. for the 1 to 5 minutes as indicated in Table I. The foil with the B-staged epoxy adhesive applied thereto is then laminated to a paper phenolic substrate at a lamination temperature of 165° C. and pressure of 1000 psig for 80 minutes. The resulting laminates are tested for adhesion using the peel strength test (2.4.8 of IPC-TM-650) and heat resistance using the solder blister test (JIS C 6481 5.5). The results are indicated in Table I.

TABLE I

| Example | Formulation | B-Stage Minutes | Peel Strength (Pounds/Inch) | Solder Blister (Seconds) |
|---|---|---|---|---|
| 1 | 75% Adduct (B-I) | 1 | 8.08 | 17.2 |
|   | 25% MT 0163 | 3 | 8.08 | 10.9 |
| 2 | 75% Adduct (B-I) | 3 | 9.15 | 21.7 |
|   | 25% Tactix 785 | 5 | 11.45 | 23.6 |
| 3 | 20% Adduct (B-I) | 3 | 11.19 | 17.9 |
|   | 55% Adduct (B-II) | 5 | 11.84 | 22.2 |
|   | 25% Tactix 785 |   |   |   |
| 4 | 25% Adduct (B-I) | 3 | 10.25 | 19.8 |
|   | 50% Adduct (B-II) | 5 | 12.33 | 28.8 |
|   | 25% Tactix 785 |   |   |   |
| 5 | 75% Adduct (B-I) | 1 | 8.57 | 11.5 |
|   | 25% DPS 164 | 3 | 8.85 | 10.2 |

EXAMPLE 6

Adduct (C-I)

75 grams of DER 664 are dissolved in 80 grams of butyl cellosolve with heating to provide an epoxy solution. 5.2 grams of ethylenediamine are added to the epoxy solution at a temperature below 70° C. The solution is stirred and heated to 80° C. for 2 hours. It is then mixed with 70 grams of PR-GNF 1 resole for 2 hours at 80° C.

The following epoxy adhesive composition is prepared:

| Component | Parts/Wt. |
|---|---|
| Adduct (B-I) | 57.2 |
| Adduct (B-II) | 7.8 |
| Tactix 785 | 25.0 |
| Adduct (C-I) | 10.0 |

Laminate samples are prepared in the same manner as in Examples 1–5 and then tested for peel strength and solder blister with the results being a peel strength of 11.2 pounds/inch and a solder blister of 28 seconds.

EXAMPLE 7

The following epoxy adhesive composition is prepared:

| Component | Parts/Wt. |
|---|---|
| Adduct (B-I) | 30 |
| Adduct (B-II) | 35 |
| MT 0163 | 20 |
| Adduct (C-I) | 10 |
| Heloxy 69 | 5 |

Laminate samples are prepared in the same manner as in Examples 1–5 and then tested for peel strength and solder blister with the results being a peel strength of 11.7 pounds/inch and a solder blister of 30 seconds.

EXAMPLE 8

Adduct (B-III)

An epoxy solution is made by mixing 100 grams of DER 664, 100 grams of DER 667, 100 grams of butyl cellosolve, and 100 grams of methylisobutylketone. 23.4 grams of 1,3-xylylenediamine are added to this epoxy solution and the resulting mixture is heated to 80° C. for 3.5 hours to provide the desired adduct (B-III).

The following epoxy adhesive composition is prepared:

| Component | Parts/Wt. |
|---|---|
| Adduct (B-I) | 25 |
| Adduct (B-II) | 25 |
| Adduct (B-III) | 20 |
| Tactix 785 | 25 |
| Heloxy 69 | 5 |

Laminate samples are prepared in the same manner as in Examples 1–5 and then tested for peel strength and solder blister with the results being a peel strength of 11.53 pounds/inch and a solder blister of 21.5 seconds.

EXAMPLE 9

The following epoxy adhesive mixture is prepared:

| Component | Parts/Wt. |
|---|---|
| DER 664 | 62.5 |
| Epon 1031 | 25 |
| m-aminophenol | 12.5 |

Laminate samples are prepared in the same manner as in Examples 1–5 and then tested for peel strength and solder blister with the results being a peel strength of 11.62 pounds/inch and a solder blister of 24.0 seconds.

While the invention has been explained in relation to its preferred embodiments, meats, it is to be understood that various modifications thereof will become apparent to those skilled in the art upon reading the specification. Therefore, it is to be understood that the invention disclosed herein is intended to cover such modifications as fall within the scope of the appended claims.

We claim:

1. A copper foil with an adhesion-promoting layer overlying at least one side of said foil, said adhesion-promoting layer, comprising:
   (A) at least one tetrafunctional epoxy; and
   (B) the composition consisting essentially of
      (B-1) at least one difunctional epoxy and
      (B-2) at least one amino-functional compound represented by aminophenol,
   wherein the ratio of equivalents of (B-1) to (B-2) is from about 1:2 to about 1:4.

2. The foil of claim 1 wherein said foil is an electrodeposited copper foil.

3. The foil of claim 1 wherein said foil is a wrought copper foil.

4. The foil of claim 1 with at least one silane coupling agent disposed between said one side of said foil and said adhesion-promoting layer, said silane-coupling agent being at least one compound represented by the formula $$R^1_{4-n}SiX_n \qquad (V)$$

wherein in Formula (V), $R^1$ is a functionally substituted hydrocarbon group, the functional substituent of said functionally substituted hydrocarbon group being amino, hydroxy, halo, mercapto, alkoxy, acyl, or epoxy; X is a hydrolyzable group; and n is 1, 2 or 3.

5. The foil of claim 1 wherein at least one roughened layer of copper or copper oxide is positioned between said one side of said foil and said adhesion promoting layer.

6. The foil of claim 1 wherein at least one metallic layer is positioned between said one side of said foil and said adhesion promoting layer, the metal in said metallic layer being selected from the group consisting of indium, tin, nickel, cobalt, brass, bronze or a mixture of two or more thereof.

7. The foil of claim 1 wherein at least one roughened layer of copper or copper oxide is adhered to said one side of said foil, at least one metallic layer is adhered to said layer of copper or copper oxide, the metal in said metallic layer being selected from the group consisting of indium, zinc, tin, nickel, cobalt, brass, bronze, or a mixture of two or more thereof, and said adhesion promoting layer is adhered to said metallic layer.

8. The foil of claim 1 wherein at least one metallic layer is positioned between said one side of said foil and said adhesion promoting layer, the metal in said metallic layer being selected from the group consisting of tin, chromium, chromium-zinc mixture, nickel, molybdenum, aluminum, and mixtures of two or more thereof, and said adhesion promoting layer is adhered to said metallic layer.

9. The foil of claim 1 wherein at least one roughened layer of copper or copper oxide is adhered to said one side of said foil, at least one metallic layer is adhered to said layer of copper or copper oxide, the metal in said metallic layer being selected from the group consisting of tin, chromium, and chromium-zinc alloy, zinc, nickel, molybdenum, aluminum, and mixtures of two or more thereof, at least one layer of at least one silane coupling agent is adhered to said metallic layer, and said adhesion promoting layer is adhered to said silane coupling agent layer.

10. The foil of claim 1 wherein at least one first metallic layer is adhered to said one side of said foil, the metal in said first metallic layer being selected from the group consisting of indium, tin, nickel, cobalt, brass and bronze, at least one second metallic layer adhered to said first metallic layer, the metal in said second metallic layer being selected from the group consisting of tin, chromium, chromium-zinc mixture, zinc, nickel, molybdenum, aluminum, and mixtures of two or more thereof, at least one layer of at least one shape coupling agent is adhered to said second metallic layer, and said adhesion promoting layer is adhered to said silane coupling agent layer.

11. The foil of claim 1 wherein at least one roughened layer of copper or copper oxide is adhered to said one side of said foil, at least one first metallic layer is adhered to said roughened layer, the metal in said first metallic layer being selected from the group consisting of indium, zinc, tin, nickel, cobalt, copper-zinc alloy and copper-tin alloy, at least one second metallic layer is adhered to said first metallic layer, the metal in said second metallic layer being selected from the group consisting of tin, chromium, chromium-zinc alloy, zinc, nickel, molybdenum, aluminum, and mixtures of two or more thereof, at least one layer of at least one silane coupling agent is adhered to said second metallic layer, and said adhesion promoting layer is adhered to said silane coupling agent layer.

12. A copper foil with an adhesion-promoting layer overlying at least one side of said foil, said adhesion-promoting layer, comprising:

(A) about 10% to about 40% by weight of at least one tetrafunctional epoxy;

(B) about 40% to about 80% by weight of a composition consisting essentially of
(B-1) at least one difunctional epoxy and
(B-2) at least one amino-functional compound represented by aminophenol; and (C) at least one of up to about 25% by weight of a supplemental adduct wherein the supplemental adduct is the reaction product of at least one difunctional epoxy resin with at least one alkylene polyamine and up to about 10% by weight of at least one low molecular weight difunctional epoxy compound.

13. The foil of claim 12 wherein said foil is an electrodeposited copper foil.

14. The foil of claim 12 wherein said foil is a wrought copper foil.

15. The foil of claim 12 with at least one silane coupling agent disposed between said one side of said foil and said adhesion-promoting layer, said silane coupling agent being at least one compound represented by the formula $$R^1_{4-n}SiX_n \qquad (V)$$

wherein in Formula (V), $R^1$ is a-functionally substituted hydrocarbon group, the functional substituent of said functionally substituted hydrocarbon group being amino, hydroxy, halo, mercapto, alkoxy, acyl, or epoxy; X is a hydrolyzable group; and n is 1, 2 or 3.

16. The foil of claim 12 wherein at least one roughened layer of copper or copper oxide is positioned between said one side of said foil and said adhesion promoting layer.

17. The foil of claim 12 wherein at least one metallic layer is positioned between said one side of said foil and said adhesion promoting layer, the metal in said metallic layer being selected from the group consisting of indium, tin, nickel, cobalt, brass, bronze or a mixture of two or more thereof.

18. The foil of claim 12 wherein at least one roughened layer of copper or copper oxide is adhered to said one side of said foil, at least one metallic layer is adhered to said layer of copper or copper oxide, the metal in said metallic layer being selected from the group consisting of indium, zinc, tin, nickel, cobalt, brass, bronze, or a mixture of two or more thereof, and said adhesion promoting layer is adhered to said metallic layer.

19. The foil of claim 12 wherein at least one metallic layer is positioned between said one side of said foil and said adhesion promoting layer, the metal in said metallic layer being selected from the group consisting of tin, chromium, chromium-zinc mixture, nickel, molybdenum, aluminum, and mixtures of two or more thereof, and said adhesion promoting layer is adhered to said metallic layer.

* * * * *